(12) United States Patent  
Jiang et al.

(10) Patent No.: US 11,211,515 B2
(45) Date of Patent: Dec. 28, 2021

(54) EDGE-MOUNTABLE SEMICONDUCTOR CHIP PACKAGE

(71) Applicant: Apple Inc., Cupertino, CA (US)

(72) Inventors: Tongbi T. Jiang, Santa Clara, CA (US); Miaolei Yan, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 51 days.

(21) Appl. No.: 16/287,965

(22) Filed: Feb. 27, 2019

(65) Prior Publication Data

US 2020/0274020 A1   Aug. 27, 2020

(51) Int. Cl.
*H01L 33/62* (2010.01)
*H01L 31/16* (2006.01)
*H01L 33/56* (2010.01)
*H01L 31/02* (2006.01)
*H01L 25/16* (2006.01)
*G01J 1/42* (2006.01)
*G01N 27/04* (2006.01)

(52) U.S. Cl.
CPC ............... *H01L 31/16* (2013.01); *G01J 1/42* (2013.01); *H01L 25/167* (2013.01); *H01L 31/02002* (2013.01); *H01L 33/56* (2013.01); *H01L 33/62* (2013.01); *G01N 27/04* (2013.01); *H01L 2933/0066* (2013.01)

(58) Field of Classification Search
CPC ......... H01L 31/02002–02013; H01L 31/0203; H01L 31/0224–022491; H01L 31/12–173; H01L 31/16; H01L 31/167; H01L 31/173; H01L 31/00–208; H01L 33/00–648; H01L 33/36–42; H01L 33/62; H01L 31/125; H01L 2224/32–3226; H01L 2224/481–4826; H01L 2224/63–70; G01J 1/42

See application file for complete search history.

(56) References Cited

U.S. PATENT DOCUMENTS

| | | | |
|---|---|---|---|
| 9,230,894 B2 | 1/2016 | Fuergut et al. | |
| 2006/0197101 A1* | 9/2006 | Wu | H01L 33/642 257/99 |
| 2008/0173890 A1* | 7/2008 | Sung | H01L 33/52 257/99 |
| 2012/0119233 A1* | 5/2012 | Weidner | H01L 31/1892 257/88 |
| 2013/0069102 A1* | 3/2013 | Kimura | H01L 33/62 257/99 |

(Continued)

*Primary Examiner* — Eric A. Ward

(74) *Attorney, Agent, or Firm* — Brownstein Hyatt Farber, LLP

(57) ABSTRACT

A device includes a semiconductor chip, and a semiconductor chip package in which the semiconductor chip is packaged. The semiconductor chip has a first major surface opposite a second major surface, and a set of four edges extending between the first major surface and the second major surface. The semiconductor chip package includes at least first and second electrodes exposed to an exterior of the semiconductor chip package and positioned apart from the semiconductor chip. The at least first and second electrodes overlap only one edge of the semiconductor chip. The semiconductor chip package also includes a filler that is molded between the semiconductor chip and each of the at least first and second electrodes.

20 Claims, 15 Drawing Sheets

(56) References Cited

U.S. PATENT DOCUMENTS

| | | | |
|---|---|---|---|
| 2013/0076233 A1* | 3/2013 | Iino | H01L 33/486 |
| | | | 313/501 |
| 2013/0285536 A1* | 10/2013 | Shimada | H01L 33/501 |
| | | | 313/501 |
| 2015/0061137 A1* | 3/2015 | Lee | H01L 21/481 |
| | | | 257/758 |
| 2015/0084202 A1* | 3/2015 | Seidemann | H01L 24/08 |
| | | | 257/773 |
| 2015/0295152 A1* | 10/2015 | Yoneda | H01L 33/0095 |
| | | | 257/98 |
| 2016/0056344 A1* | 2/2016 | Reill | H01L 33/005 |
| | | | 257/98 |
| 2016/0099387 A1 | 4/2016 | Tsutsui et al. | |
| 2017/0077070 A1* | 3/2017 | Schwarz | H01L 33/62 |
| 2017/0141257 A1* | 5/2017 | Tsai | H01L 25/167 |
| 2017/0221857 A1 | 8/2017 | Mahlet et al. | |
| 2018/0069163 A1* | 3/2018 | Clark | H01L 33/44 |
| 2018/0108695 A1* | 4/2018 | Maute | H01L 33/465 |
| 2018/0175237 A1* | 6/2018 | Linkov | H01L 33/0008 |
| 2018/0182943 A1* | 6/2018 | von Malm | H01L 33/60 |
| 2018/0190628 A1* | 7/2018 | Male | H01L 31/02005 |
| 2019/0252312 A1* | 8/2019 | Yu | H01L 21/76837 |

* cited by examiner

EDGE-MOUNTABLE SEMICONDUCTOR CHIP PACKAGE

FIELD

The described embodiments relate generally to semiconductor chip packaging. More particularly, the described embodiments relate to an edge-mountable semiconductor chip package that enables a semiconductor chip included within the package to be oriented perpendicular to a substrate or device on which the semiconductor chip package is mounted. A semiconductor chip, packaged as described herein, may in some cases be used as part of, or in combination with, a sensor system.

BACKGROUND

In some cases, a sensor system may include a light emitter and a light receiver. For example, a sensor system may include a light emitter that emits light into a target medium (e.g., air, a liquid, a body part, etc.), and a light receiver that receives a portion of the emitted light. The portion of emitted light received by the light receiver may pass through the medium and be, by the medium or an optional reflector, toward the light receiver. A processor may make various determinations using parameters of the emitted and received light. For example, the processor may determine the presence or absence of a particular type of medium, a medium type, a quality or density of the medium, and so on.

As another example, a light emitter may emit light (e.g., ultraviolet (UV) light) that is reflected toward a sensor (e.g., an optical or resistive sensor) to clean or regenerate the sensor.

SUMMARY

Embodiments of the systems, devices, methods, and apparatus described in the present disclosure are directed to an edge-mountable semiconductor chip package. An edge-mountable semiconductor chip package enables a semiconductor chip included within the package to be oriented perpendicular to a substrate or device on which the package is mounted. In some cases, the packaging of a semiconductor chip in such a package can improve the layout, operation, or effectiveness of a sensor system. For example, the layout, operation, or effectiveness of a sensor system including one or more electromagnetic radiation emitters or sensors may be improved, or the layout, operation, or effectiveness of a sensor system including one or more movement, proximity, position, or orientation sensors may be improved.

In a first aspect, the present disclosure describes a semiconductor chip package. The semiconductor chip package may include a semiconductor chip. The semiconductor chip may have a first major surface opposite a second major surface, and a set of conductors disposed on at least one of the first major surface or the second major surface. The semiconductor chip package may further include a set of electrodes positioned apart from the semiconductor chip and exposed to an exterior edge of the semiconductor chip package, an epoxy molded between the semiconductor chip and each electrode in the set of electrodes, and a set of redistribution layers electrically connecting the set of conductors to the set of electrodes.

In another aspect, the present disclosure describes a device including a semiconductor chip and a semiconductor chip package in which the semiconductor chip is packaged. The semiconductor chip may have a first major surface opposite a second major surface, and a set of four edges extending between the first major surface and the second major surface. The semiconductor chip package may include at least first and second electrodes exposed to an exterior of the semiconductor chip package and positioned apart from the semiconductor chip. The at least first and second electrodes may overlap only one edge of the semiconductor chip. The semiconductor chip package may also include a filler that is molded between the semiconductor chip and each of the at least first and second electrodes.

In still another aspect of the disclosure, a sensor system is described. The sensor system may include a substrate, a sensor mounted on the substrate, and a semiconductor chip package mounted on the substrate. The semiconductor chip package may include a semiconductor chip oriented perpendicularly to the substrate. The semiconductor chip may include a surface-emitting electromagnetic radiation source, and the surface-emitting electromagnetic radiation source may be configured to emit electromagnetic radiation that impinges directly on the sensor.

In addition to the exemplary aspects and embodiments described above, further aspects and embodiments will become apparent by reference to the drawings and by study of the following description.

BRIEF DESCRIPTION OF THE DRAWINGS

The disclosure will be readily understood by the following detailed description in conjunction with the accompanying drawings, wherein like reference numerals designate like structural elements, and in which.

Figure 1A:
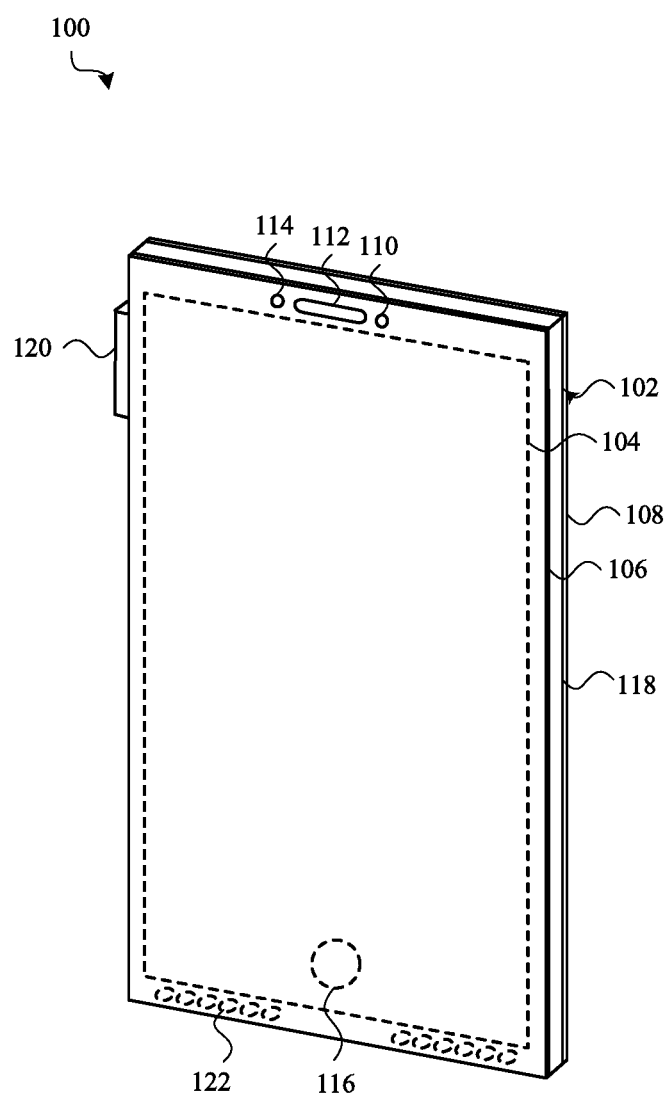
FIGS. 1A and 1B show a first example of a device that may include a sensor system.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Reference will now be made in detail to representative embodiments illustrated in the accompanying drawings. It should be understood that the following description is not intended to limit the embodiments to one preferred embodiment. To the contrary, it is intended to cover alternatives, modifications, and equivalents as can be included within the spirit and scope of the described embodiments as defined by the appended claims.

The following description relates to an edge-mountable semiconductor chip package. The package enables a semiconductor chip mounted within the package to be oriented perpendicular to a substrate or device on which the semiconductor chip package is mounted. Stated differently, the package enables a surface emitter/detector having an emission/detection path that is perpendicular to an emission/detection surface (of a semiconductor chip) to be mounted such that the emission/detection surface is perpendicular to a substrate, and the emission/detection path is parallel to the substrate. For example, a semiconductor chip including an electromagnetic radiation emitter, such as an ultraviolet (UV) light emitter or infrared (IR) light emitter, may be included in such a package. Alternatively, a semiconductor chip including another type of electromagnetic radiation emitter may be included in such a package. A semiconductor chip including a sensor (e.g., a photodetector (i.e., an electromagnetic radiation sensor) or resistive gas sensor) may also be included in such a package, and may be included in the same package, or in a different package, as an electromagnetic radiation source (or emitter). In some embodiments, semiconductor chips including other types of emitters or detectors, may be included in such a package. These other types of emitters or detectors include, for example, emitters or detectors based on magnetic, electromagnetic, capacitive, ultrasonic, resistive, optical, acoustic, piezoelectric, mechanical (e.g., micromechanical), microelectromechanical (e.g., MEMS)), or thermal technologies. Emitters or detectors that employ such technologies include, for example, a magnetometer, an inertial motion unit (IMU) such as an accelerometer or gyroscope, a variety of multi-axis (e.g., 3-axis) sensor components, a proximity sensor, a time-of-flight (ToF) sensor, and so on. In some cases, a combination of same, similar, or different type emitters, transmitters, other sensors, or other type of semiconductor devices may be incorporated into an edge-mountable semiconductor chip package (e.g., an array of emitters, an array of detectors, an emitter and a detector, a sensor and a memory, a hybrid device, and so on). The different semiconductor devices incorporated into an edge-mountable semiconductor chip package may be included in the same or different semiconductor chips within the edge-mountable semiconductor chip package.

A semiconductor chip included in an edge-mountable semiconductor chip package may in some cases be used as part of, or in combination with, a sensor system. In these cases, the layout, operation, or effectiveness of the sensor system may be improved by virtue of the semiconductor chip being included in the edge-mountable semiconductor chip package. For example, a semiconductor chip including a UV light emitter may be included in an edge-mountable semiconductor chip package, and the mounting of the package may orient the UV light emitter to emit UV light parallel to (or sideways to) a substrate. The emitted UV light may impinge directly on a sensor (albeit at a relatively great incident angle) and clean or regenerate the sensor. In some embodiments, the sensor may include a photodetector or a resistive gas sensor. Cleaning the sensor may include, for example, removing photo-oxidation from a photodetector, which photo-oxidation may be caused by an organic contaminant and interfere with the sensor's ability to sense. Regenerating the sensor may include, for example, resetting the surface absorption state of a resistive gas sensor via photo-excitation, to improve the sensor's ability to sense. In some embodiments, the sensor may be oriented parallel to the substrate. In other embodiments, the sensor may be included in a second edge-mountable semiconductor chip package, with the package being mounted on the substrate so that the UV light emitter faces the sensor and emits at least some light that impinges on a detection surface of the sensor at a right angle. In some cases, such sensor systems may be used to determine particulate matter concentration or air quality, or to determine the presence of a particular type of gas.

As another example, a semiconductor chip including an IR light emitter may be included in a first edge-mountable chip package, and the mounting of the package may orient the IR light emitter to emit IR light parallel to a substrate. The IR light may impinge directly on a light detection surface of a photodetector that is oriented perpendicular to the substrate by a second edge-mountable semiconductor chip package including the photodetector. In this manner, light emitted by the IR light emitter may pass through a medium, be received by the photodetector, and be quantified or analyzed to determine, for example, the presence or absence of a particular type of medium, a medium type, a quality or density of the medium, and so on. In some cases, such sensor systems may be used to determine particulate matter concentration or air quality, to determine the presence of a particular type of gas, or to determine whether a wearable device (e.g., a smart watch) is on or off of a user's wrist.

In another example, a magnetometer or IMU may include a collection of semiconductor chips, with each chip including, for example, a device or sensing component used to detect a magnetic field, motion, or orientation with respect to a different axis (e.g., magnetic field, motion, or orientation with respect to an x, y, or z axis). In these types of sensor systems, three same or similar-type semiconductor chips may be oriented differently to sense magnetic field, motion, or orientation with respect to a different axis. Packaging a semiconductor chip in an edge-mountable semiconductor chip package can enable it to be oriented along a different axis than another similarly semiconductor chip package or semiconductor chip packaged in a conventional surface-mountable package.

These and other embodiments are discussed with reference to FIGS. 1A-12. However, those skilled in the art will readily appreciate that the detailed description given herein with respect to these figures is for explanatory purposes only and should not be construed as limiting.

Directional terminology, such as "top", "bottom", "upper", "lower", "front", "back", "over", "under", "above", "below", "left", "right", etc. is used with reference to the orientation of some of the components in some of the figures described below. Because components in various embodiments can be positioned in a number of different orientations, directional terminology is used for purposes of illustration only and is in no way limiting. The directional terminology is intended to be construed broadly, and therefore should not be interpreted to preclude components being oriented in different ways. The use of alternative terminology, such as "or", is intended to indicate different combinations of the alternative elements. For example, A or B is intended to include A, or B, or A and B.

Figure 1B:
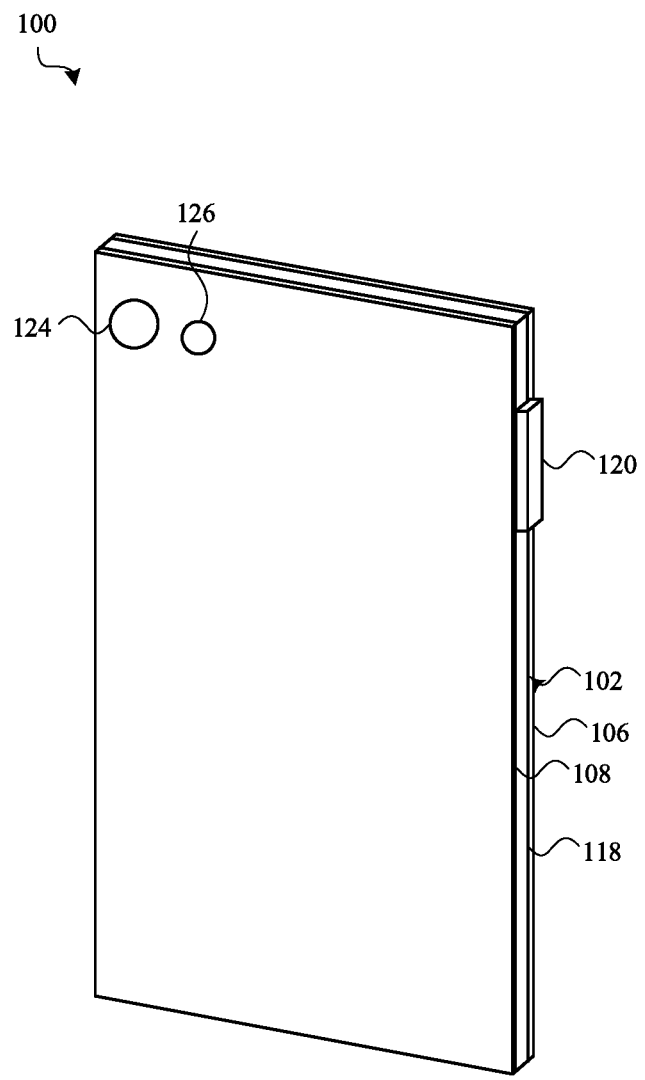

FIGS. 1A and 1B show a first example of a device 100 that may include a sensor system. The device's dimensions and form factor, including the ratio of the length of its long sides to the length of its short sides, suggest that the device 100 is a mobile phone (e.g., a smartphone). However, the device's dimensions and form factor are arbitrarily chosen, and the device 100 could alternatively be any portable electronic device including, for example a mobile phone, tablet computer, portable computer, portable music player, health monitor device, portable terminal, or other portable or mobile device. The device 100 could also be a device that is semi-permanently located (or installed) at a single location. FIG. 1A shows a front isometric view of the device 100, and FIG. 1B shows a rear isometric view of the device 100. The device 100 may include a housing 102 that at least partially surrounds a display 104. The housing 102 may include or support a front cover 106 or a rear cover 108. The front cover 106 may be positioned over the display 104, and may provide a window through which the display 104 may be viewed. In some embodiments, the display 104 may be attached to (or abut) the housing 102 and/or the front cover 106.

The display 104 may include one or more light-emitting elements including, for example, a light-emitting display (LED), organic light-emitting display (OLED), liquid crystal display (LCD), electroluminescent display (EL), or other type of display element. The display 104 may also include, or be associated with, one or more touch and/or force sensors that are configured to detect a touch and/or a force applied to a surface of the front cover 106.

The various components of the housing 102 may be formed from the same or different materials. For example, the sidewall 118 may be formed using one or more metals (e.g., stainless steel), polymers (e.g., plastics), ceramics, or composites (e.g., carbon fiber). In some cases, the sidewall 118 may be a multi-segment sidewall including a set of antennas. The antennas may form structural components of the sidewall 118. The antennas may be structurally coupled (to one another or to other components) and electrically isolated (from each other or from other components) by one or more non-conductive segments of the sidewall 118. The front cover 106 may be formed, for example, using one or more of glass, a crystal (e.g., sapphire), or a transparent polymer (e.g., plastic) that enables a user to view the display 104 through the front cover 106. In some cases, a portion of the front cover 106 (e.g., a perimeter portion of the front cover 106) may be coated with an opaque ink to obscure components included within the housing 102. The rear cover 108 may be formed using the same material(s) that are used to form the sidewall 118 or the front cover 106. In some cases, the rear cover 108 may be part of a monolithic element that also forms the sidewall 118 (or in cases where the sidewall 118 is a multi-segment sidewall, those portions of the sidewall 118 that are non-conductive). In still other embodiments, all of the exterior components of the housing 102 may be formed from a transparent material, and components within the device 100 may or may not be obscured by an opaque ink or opaque structure within the housing 102.

The front cover 106 may be mounted to the sidewall 118 to cover an opening defined by the sidewall 118 (i.e., an opening into an interior volume in which various electronic components of the device 100, including the display 104, may be positioned). The front cover 106 may be mounted to the sidewall 118 using fasteners, adhesives, seals, gaskets, or other components.

A display stack or device stack (hereafter referred to as a "stack") including the display 104 may be attached (or abutted) to an interior surface of the front cover 106 and extend into the interior volume of the device 100. In some cases, the stack may include a touch sensor (e.g., a grid of capacitive, resistive, strain-based, ultrasonic, or other type of touch sensing elements), or other layers of optical, mechanical, electrical, or other types of components. In some cases, the touch sensor (or part of a touch sensing system) may be configured to detect a touch applied to an outer surface of the front cover 106 (e.g., to a display surface of the device 100).

In some cases, a force sensor (or part of a force sensing system) may be positioned within the interior volume below and/or to the side of the display 104 (and in some cases within the device stack). The force sensor (or force sensing system) may be triggered in response to the touch sensor detecting one or more touches on the front cover 106 (or a location or locations of one or more touches on the front cover 106), and may determine an amount of force associated with each touch, or an amount of force associated with the collection of touches as a whole.

As shown primarily in FIG. 1A, the device 100 may include various other components. For example, the front of the device 100 may include one or more front-facing cameras 110, speakers 112, microphones, or other components 114 (e.g., audio, imaging, or sensing components) that are configured to transmit or receive signals to/from the device 100. In some cases, a front-facing camera 110, alone or in combination with other sensors, may be configured to operate as a bio-authentication or facial recognition sensor. The device 100 may also include various input devices, including a mechanical or virtual button 116, which may be accessible from the front surface (or display surface) of the device 100. In some cases, the front-facing camera 110, virtual button 116, and/or other sensors of the device 100 may be integrated with a display stack of the display 104 and moved under the display 104.

The device 100 may also include buttons or other input devices positioned along the sidewall 118 and/or on a rear surface of the device 100. For example, a volume button or multipurpose button 120 may be positioned along the sidewall 118, and in some cases may extend through an aperture in the sidewall 118. The sidewall 118 may include one or more ports 122 that allow air, but not liquids, to flow into and out of the device 100. In some embodiments, one or more sensors may be positioned in or near the port(s) 122. For example, an ambient pressure sensor, ambient temperature sensor, internal/external differential pressure sensor, gas sensor, particulate matter concentration sensor, or air quality sensor may be positioned in or near a port 122.

In some embodiments, the rear surface of the device 100 may include a rear-facing camera 124 or other optical sensor (see FIG. 1B). A flash or light source 126 may also be positioned along the rear of the device 100 (e.g., near the rear-facing camera). In some cases, the rear surface of the device 100 may include multiple rear-facing cameras.

The camera(s), microphone(s), pressure sensor(s), temperature sensor(s), biometric sensor(s), button(s), proximity sensor(s), touch sensor(s), force sensor(s), particulate matter or air quality sensor(s), and so on of the device 100 may be referred to herein as sensor systems (or collectively, as a sensor system). The sensor system(s) of the device 100 may also include a magnetometer, an IMU such as an accelerometer or gyroscope, a variety of multi-axis (e.g., 3-axis) sensor components, a ToF sensor, and so on. The layout, operation, effectiveness, or other parameters of some of these sensor systems may be improved, in some cases, by incorporating a semiconductor chip of the sensor system into an edge-mountable semiconductor chip package that can be mounted such that the semiconductor chip is oriented perpendicular to a substrate or device on which the package is mounted.

Figure 2A:
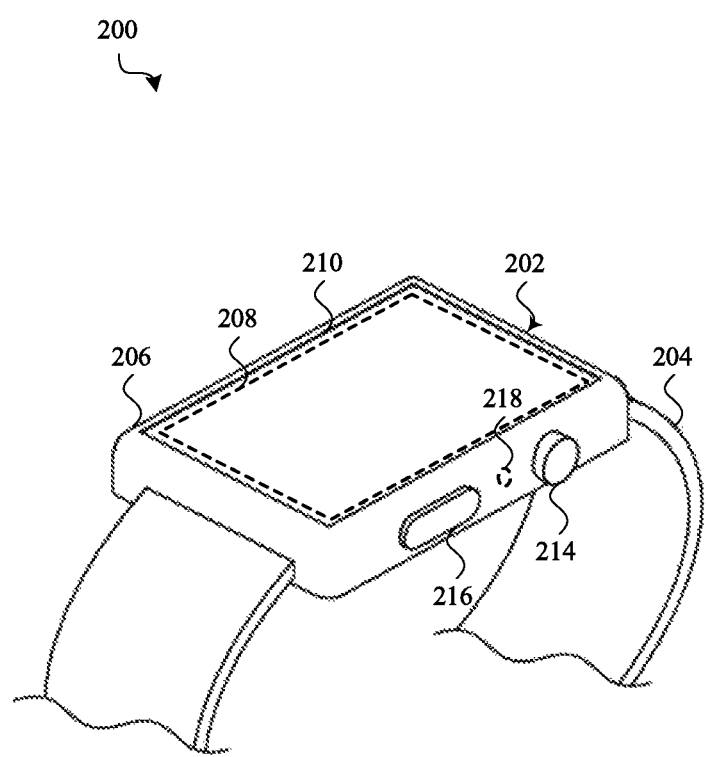
FIGS. 2A and 2B show a second example of a device that may include a sensor system.
Figure 2B:
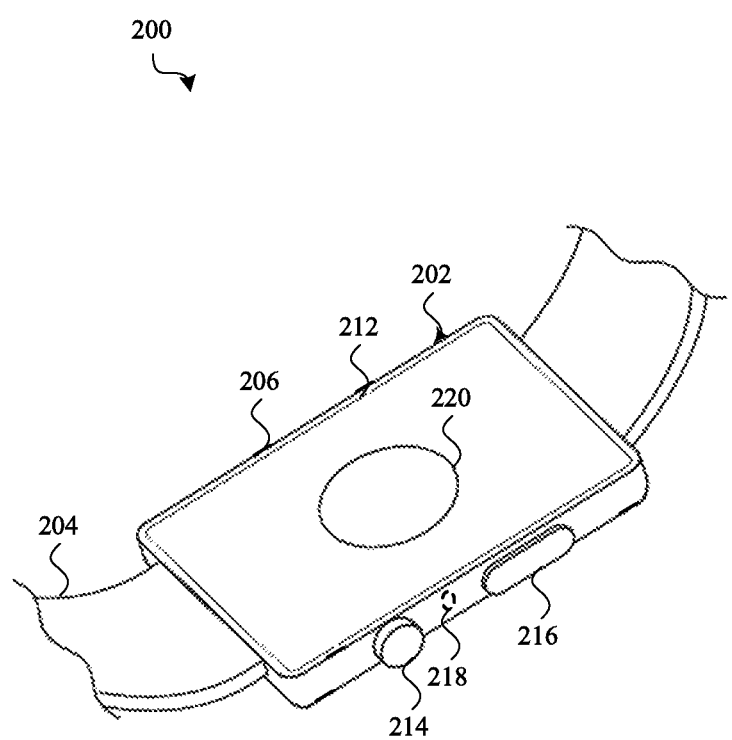

FIGS. 2A and 2B show a second example of a device 200 that may include a sensor system. The device's dimensions and form factor, and inclusion of a band 204, suggest that the device 200 is a smart watch. However, the device 200 could alternatively be any wearable electronic device. FIG. 2A shows a front isometric view of the device 200, and FIG. 2B shows a rear isometric view of the device 200. The device 200 may include a body 202 (e.g., a watch body) and a band 204. The watch body 202 may include an input or selection device, such as a crown 214 or a button 216. The band 204 may be used to attach the body 202 to a body part (e.g., an arm, wrist, leg, ankle, or waist) of a user. The body 202 may include a housing 206 that at least partially surrounds a display 208. The housing 206 may include or support a front cover 210 (FIG. 2A) or a rear cover 212 (FIG. 2B). The front cover 210 may be positioned over the display 208, and may provide a window through which the display 208 may be viewed. In some embodiments, the display 208 may be attached to (or abut) the housing 206 and/or the front cover 210.

The housing 206 may in some cases be similar to the housing 102 described with reference to FIGS. 1A-1B, and the display 208 may in some cases be similar to the display 104 described with reference to FIGS. 1A-1B.

The device 200 may include various sensor systems, and in some embodiments may include some or all of the sensor systems included in the device 100 described with reference to FIGS. 1A-1B. In some embodiments, the device 200 may have a port 218 (or set of ports) on a side of the housing 206 (or elsewhere), and a sensor system including an ambient pressure sensor, ambient temperature sensor, internal/external differential pressure sensor, gas sensor, particulate matter concentration sensor, or air quality sensor may be positioned in or near the port(s) 218.

In some cases, the rear surface (or skin-facing surface) of the device 200 may include a flat or raised area 220 that includes one or more skin-facing sensor systems. For example, the area 220 may include a heart rate monitor, such as a heart rate monitor including a photoplethysmography (PPG) sensor. The area 220 may also include an off-wrist detector, or other sensor systems.

Figure 3:
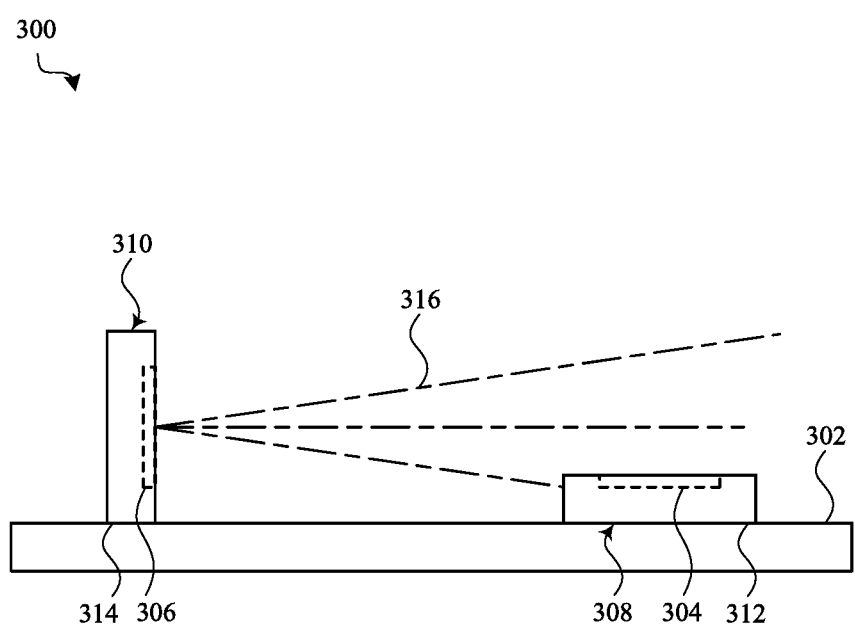
FIG. 3 shows a first example of a sensor system that may be included in a device.

FIG. 3 shows a first example of a sensor system 300 that may be included in a device. In some cases, the sensor system 300 may be included in one of the devices 100, 200 described with reference to FIGS. 1A-1B or 2A-2B. The sensor system 300 may include a substrate 302 on which a sensor (e.g., an electromagnetic radiation sensor or resistive gas sensor) and an electromagnetic radiation source may be mounted. The sensor may be provided on a first semiconductor chip 304 that is oriented planar to the substrate 302 (e.g., with first and second major surfaces of the semiconductor chip 304 oriented parallel to the substrate 302), and the electromagnetic radiation source may be provided on a second semiconductor chip 306 that is oriented perpendicular to the substrate 302 (e.g., with first and second major surfaces of the semiconductor chip 306 oriented perpendicular to the substrate 302).

The first semiconductor chip 304 may be included in a first semiconductor chip package 308, and the second semiconductor chip 306 may be included in a second semiconductor chip package 310. By way of example, the first semiconductor chip package 308 may be a ball grid array (BGA) package or land grid array (LGA) package, having contacts on a major planar surface thereof (e.g., on its bottom surface 312 in FIG. 3). The first semiconductor chip 304 may be electrically connected to electrical contacts (e.g., solder balls or conductive pads) on the first semiconductor chip package 308, and electrically connected to electrical contacts on the substrate 302 via the electrical contacts on the first semiconductor chip package 308.

The second semiconductor chip package 310 may have a set of electrodes (e.g., one or more electrodes) disposed on an edge 314 thereof. The electrodes may be used to mount the second semiconductor chip package 310 to the substrate 302 and electrically connect the second semiconductor chip 306 to the substrate 302. The second semiconductor chip package 310 is therefore an "edge-mountable" semiconductor chip package.

In some embodiments, the electromagnetic radiation source may be a UV light emitter, and the inclusion of the second semiconductor chip 306 in the second semiconductor chip package 310, and edge-mounting of the second semiconductor chip package 310 to the substrate 302, may orient the UV light emitter to emit UV light 316 parallel to (or sideways to) the substrate 302. The emitted UV light 316 may impinge on a sensor provided by the first semiconductor chip 304 and clean or regenerate the sensor.

In some embodiments of the sensor system 300, the first and second semiconductor chip packages 308, 310 may be mounted to different substrates or devices.

In alternative embodiments of the apparatus shown in FIG. 3, each of the first semiconductor chip 304 and second semiconductor chip 306 may include any type of semiconductor device (or devices) referred to herein, or include any other type of semiconductor device (or devices). In some cases, at least one of the semiconductor chips 304, 306 may include an emitter or transmitter, and the other one of the semiconductor chips 304, 306 may include a detector or receiver or otherwise be configured or positioned to receive electromagnetic radiation waves, ultrasonic waves, and so on emitted by the emitter or transmitter.

Figure 4:
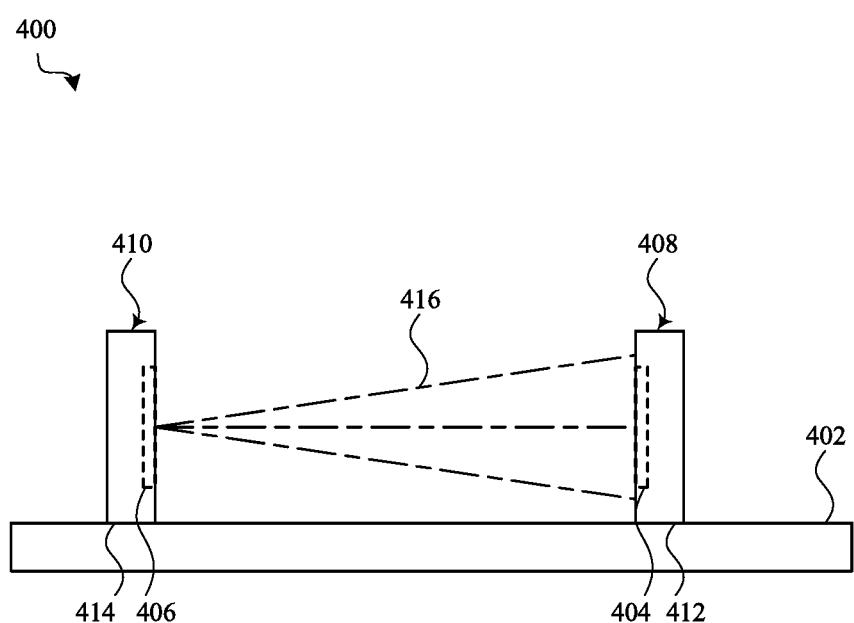
FIG. 4 shows a first example of a sensor system that may be included in a device.

FIG. 4 shows a second example of a sensor system 400 that may be included in a device. In some cases, the sensor system 400 may be included in one of the devices 100, 200 described with reference to FIGS. 1A-1B or 2A-2B. The sensor system 400 may include a substrate 402 on which a sensor (e.g., an electromagnetic radiation sensor or resistive gas sensor) and an electromagnetic radiation source are mounted. The sensor may be provided on a first semiconductor chip 404 that is oriented perpendicular to the substrate 402 (e.g., with first and second major surfaces of the semiconductor chip 404 oriented perpendicular to the substrate 402), and the electromagnetic radiation source may be provided on a second semiconductor chip 406 that is oriented perpendicular to the substrate 402.

The first semiconductor chip 404 may be included in a first semiconductor chip package 408, and the second semiconductor chip 406 may be included in a second semiconductor chip package 410. By way of example, the first semiconductor chip package 408 may have a set of electrodes (e.g., one or more electrodes) disposed on an edge 412 thereof. The electrodes may be used to mount the first semiconductor chip package 408 to the substrate 402 and electrically connect the first semiconductor chip 404 to the substrate 402. The first semiconductor chip package 408 is therefore an "edge-mountable" semiconductor chip package. Similarly, the second semiconductor chip package 410 may have a set of electrodes (e.g., one or more electrodes) disposed on an edge 414 thereof. The electrodes may be used to mount the second semiconductor chip package 410 to the substrate 402 and electrically connect the second semiconductor chip 406 to the substrate 402, with the electromagnetic radiation source provided on the second semiconductor chip 406 facing the sensor provided on the first semiconductor chip 404.

In some embodiments, the electromagnetic radiation source may be an IR light emitter (e.g., a VCSEL IR light emitter), and the inclusion of the second semiconductor chip 406 in the second semiconductor chip package 410, and edge-mounting of the second semiconductor chip package 410 to the substrate 402, may orient the IR light emitter to emit IR light 416 parallel to (or sideways to) the substrate 402. The emitted IR light 416 may be emitted toward a photodetector provided by the first semiconductor chip 404 and impinge directly on the photodetector.

Light emitted by the IR light emitter may pass through a medium, be received by the photodetector, and be quantified or analyzed to determine, for example, the presence or absence of a particular type of medium, a medium type, a quality or density of the medium, and so on. In some cases, such a sensor system 400 may be used to determine particulate matter concentration or air quality, to determine the presence of a particular type of gas, or to determine whether a wearable device (e.g., a smart watch) is on or off of a user's wrist.

In some embodiments of the sensor system 400, the first and second semiconductor chip packages 408, 410 may be mounted to different substrates or devices.

In alternative embodiments of the apparatus shown in FIG. 4, each of the first semiconductor chip 404 and second semiconductor chip 406 may include any type of semiconductor device (or devices) referred to herein, or include any other type of semiconductor device (or devices). In some cases, at least one of the semiconductor chips 404, 406 may include an emitter or transmitter, and the other one of the semiconductor chips 404, 406 may include a detector or receiver or otherwise be configured or positioned to receive electromagnetic radiation waves, ultrasonic waves, and so on emitted by the emitter or transmitter.

Figure 5:
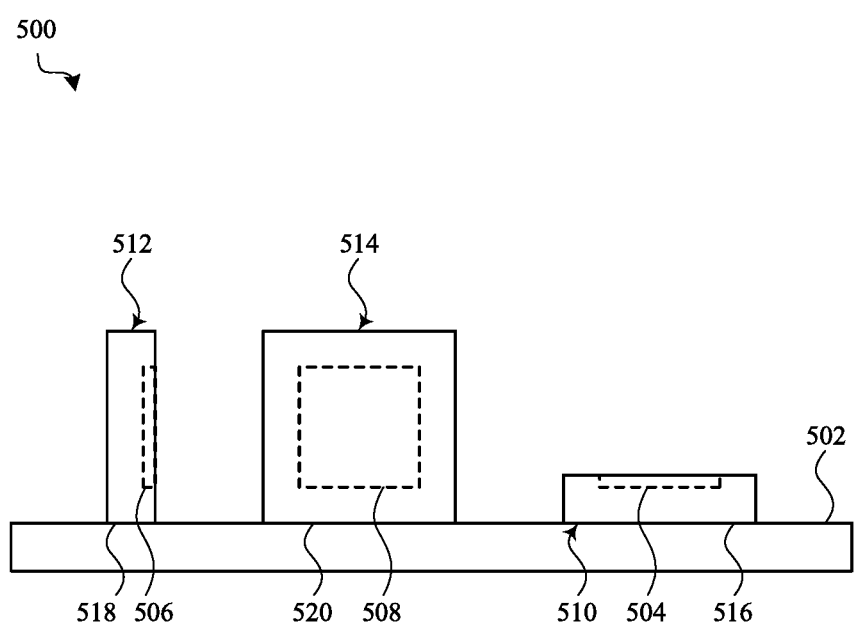
FIG. 5 shows a first example of a sensor system that may be included in a device.

FIG. 5 shows a third example of a sensor system 500 that may be included in a device. In some cases, the sensor system 500 may be included in one of the devices 100, 200 described with reference to FIGS. 1A-1B or 2A-2B. The sensor system 500 may include a substrate 502 on which a set of orientation sensors, including x, y, and z orientation sensors, may be mounted. The x orientation sensor may be provided on a first semiconductor chip 504 that is oriented parallel to the substrate 502 (e.g., with first and second major surfaces of the semiconductor chip 504 oriented parallel to the substrate 502). The y orientation sensor may be provided on a second semiconductor chip 506 that is oriented perpendicular to the substrate 502. The z orientation sensor may be provided on a third semiconductor chip 508 that is oriented perpendicular to both the substrate 502 and the second semiconductor chip 506.

The first semiconductor chip 504 may be included in a first semiconductor chip package 510, the second semiconductor chip 506 may be included in a second semiconductor chip package 512, and the third semiconductor chip 508 may be included in a third semiconductor chip package 514. By way of example, the first semiconductor chip package 510 may be a BGA package or LGA package, having contacts on a major planar surface thereof (e.g., on its bottom surface 516 in FIG. 5). The first semiconductor chip 504 may be electrically connected to electrical contacts (e.g., solder balls or conductive pads) on the first semiconductor chip package 510, and electrically connected to electrical contacts on the substrate 502 via the electrical contacts on the first semiconductor chip package 510.

The second semiconductor chip package 512 may have a set of electrodes (e.g., one or more electrodes) disposed on an edge 518 thereof. The electrodes may be used to mount the second semiconductor chip package 512 to the substrate 502 and electrically connect the second semiconductor chip 506 to the substrate 502. Similarly, the third semiconductor chip package 514 may have a set of electrodes (e.g., one or more electrodes) disposed on an edge 520 thereof. The electrodes may be used to mount the third semiconductor chip package 514 to the substrate 502 and electrically connect the third semiconductor chip 508 to the substrate 502.

FIGS. 6A-6K illustrate a method of packaging a semiconductor chip such that the semiconductor chip may be oriented perpendicular to a substrate or device on which the semiconductor chip package is mounted. The method described with reference to FIGS. 6A-6K may be used to form any of the edge-mountable semiconductor chip packages described herein. However, the edge-mountable semiconductor chip packages described herein may also be formed in other ways.

Figure 6A:
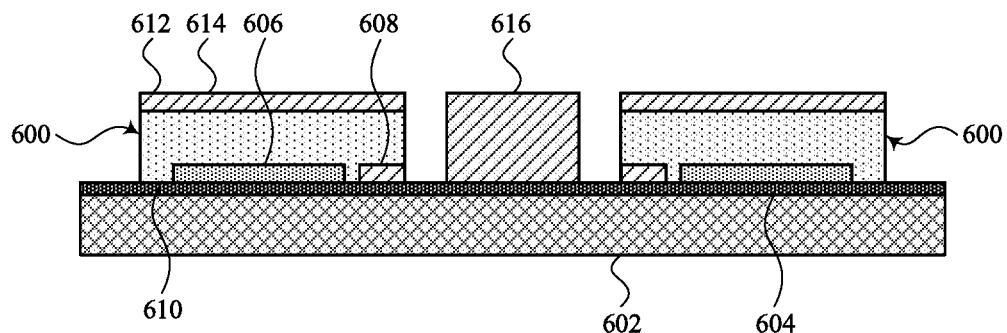
FIGS. 6A-6K illustrate a method of packaging a semiconductor chip such that the semiconductor chip may be oriented perpendicular to a substrate on which the semiconductor chip package is mounted.

As shown in FIG. 6A, a plurality of semiconductor chips 600 may be attached to a carrier 602 (e.g., a semiconductor wafer, glass, plastic, or other type of substrate). In some cases, the semiconductor chips 600 may be arranged in a grid on a surface of the carrier 602. FIG. 6A shows a cross-section of first and second adjacent semiconductor chips 600 on the carrier 602. The semiconductor chips 600 may be adhered to a surface of the carrier 602 by a liquid or solid adhesive 604 (e.g., an adhesive tape or adhesive film), or by other means. In some cases, exposure of the adhesive 604 to electromagnetic radiation or heat may cause the semiconductor chips 600 to attach to (or be released from) the carrier 602.

By way of example, the semiconductor chips 600 shown in FIG. 6A are light-emitting diode (LED) chips. That is, each semiconductor chip 600 has an LED 606 formed therein or thereon. One or more conductors 608 (e.g., part of a metallization layer) on the front surface 610 of each semiconductor chip 600 may provide a bond pad or cathode for the LED 606, and one or more conductors 612 (e.g., part or all of a backside metallization (BSM) layer) on the back surface 614 of each semiconductor chip 600 (with the back surface 614 being opposite the front surface 610) may provide a bond pad or anode for the LED 606. In alternative embodiments, a cathode and an anode (e.g., bond pads for both a cathode and an anode of a LED 606) may be provided on the front surface 610 or light-emitting surface of a semiconductor chip 600, or a cathode and an anode (e.g., bond pads for both a cathode and an anode) may be provided on the back surface 614 of a semiconductor chip 600. The BSM layer may in some cases include a titanium-nickel-gold (TiNiAu) layer (e.g., multiple thin layers of Ti, Ni, and Au) or a titanium-nickel-silver (TiNiAg) layer. These types of BSM layers may provide good ohmic contact and be anti-tarnish.

A semiconductor chip 600 may alternatively have more than two bond pads, with the multiple bond pads distributed on one or both major surfaces 610, 614 of the semiconductor chip 600. In further alternative embodiments, a semiconductor chip 600 may have a photodetector, other type of electromagnetic radiation source or electromagnetic radiation detector, or other type of emitter or detector formed therein or thereon, and the emitter or detector may be associated with any number of electrical contacts or bond pads. Examples of surface-emitting electromagnetic radiation sources that may be included on a semiconductor chip 600 include: a vertical-cavity surface-emitting laser (VCSEL), a vertical external-cavity surface-emitting laser (VECSEL), or one of a number of types of LED (e.g., an organic LED (OLED), a resonant-cavity LED (RC-LED), a micro LED (mLED), a superluminescent LED (SLED), an edge-emitting LED, and so on). These surface-emitting electromagnetic radiation sources may in some cases be configured to emit deep UV to long wavelength IR electromagnetic radiation.

In FIG. 6A, the semiconductor chips 600 are attached to the carrier 602 in a face-down configuration, to protect the light-emitting surface of each LED 606 as the semiconductor chips 600 are packaged. The semiconductor chips 600 could alternatively be attached to the carrier 602 in a bottom-down configuration.

Blocks of strips of conductive material 616 (e.g., copper blocks) may be attached to the carrier 602, at positions disposed between and apart from adjacent semiconductor chips 600. Although only one block of conductive material 616 is shown in FIG. 6A, one or more additional blocks of conductive material 616 may be positioned in front of or behind the block of conductive material 616 shown, between the first and second adjacent semiconductor chips 600. See, for example, the example plan view of the semiconductor chips 600 and blocks of conductive material 616 in FIG. 7A or 7B. The block(s) of conductive material 616 may be used to form a set of electrodes (e.g., one or more electrodes) for each of the semiconductor chips 600, and in some cases, each block of conductive material 616 (or at least some blocks) may be used to form electrodes for each of at least two adjacent semiconductor chips 600. The blocks of conductive material 616 (and electrodes that are ultimately formed from the blocks of conductive material 616) may be in-plane with the semiconductor chip 600. For purposes of this description, in-plane objects are defined to be objects having heights that differ by no more than 20%, which heights overlap by at least 80%.

Figure 6B:
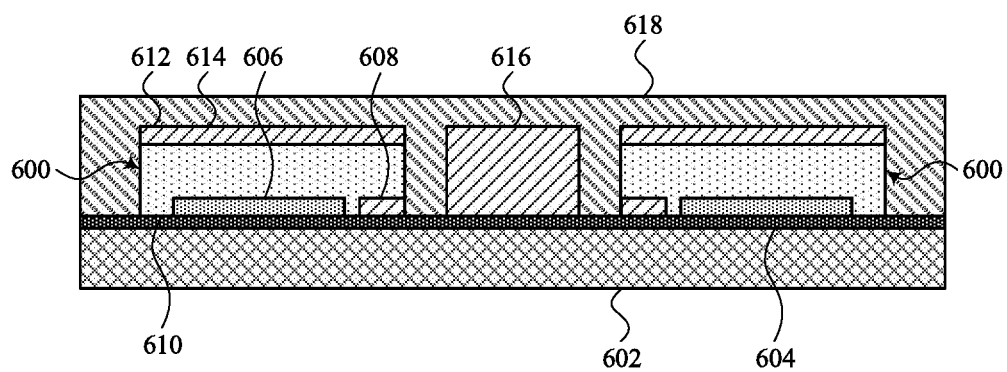

Each semiconductor chip 600 may have a set of edges that extend between the front and back surfaces 610, 614 of the semiconductor chip 600. As shown in FIG. 6B, a filler 618, such as an epoxy (e.g., an epoxy molding compound (EMC)) may be molded around the set of edges and between the semiconductor chips 600 and block(s) of conductive material 616. For example, the filler 618 may be molded between each semiconductor chip 600 and each block of conductive material 616, and also between adjacent blocks of conductive material 616. The filler 618 may also be molded (e.g., over-molded) over the back surface 614 of each semiconductor chip 600, and over the back surface of each block of conductive material 616.

Figure 6C:
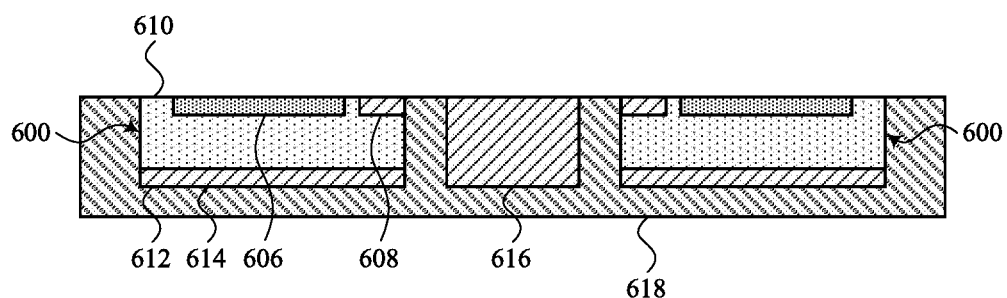
Figure 6D:
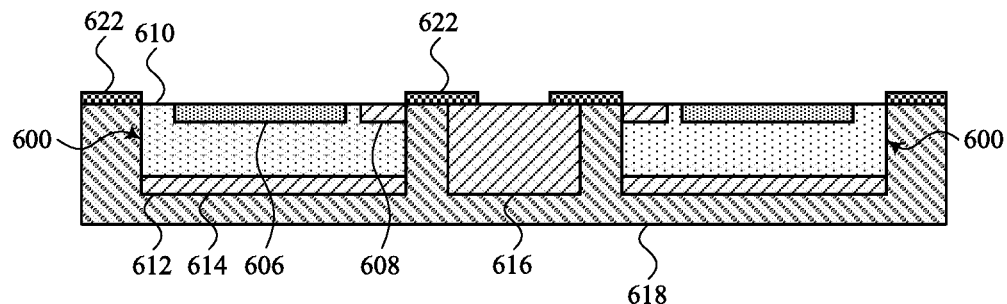
Figure 6E:
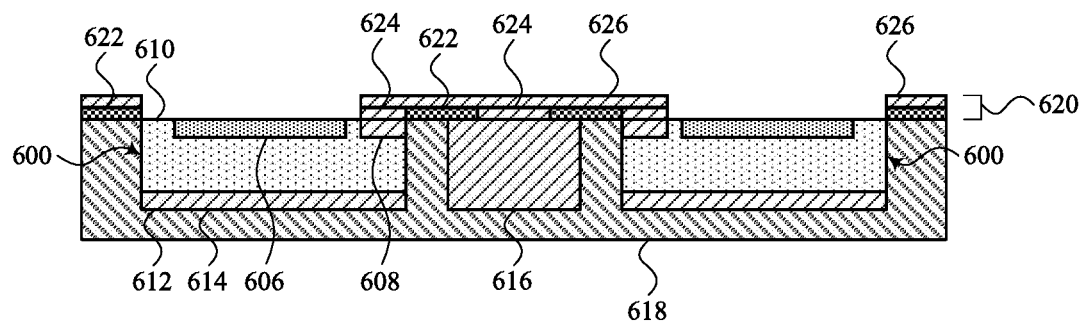
Figure 6F:
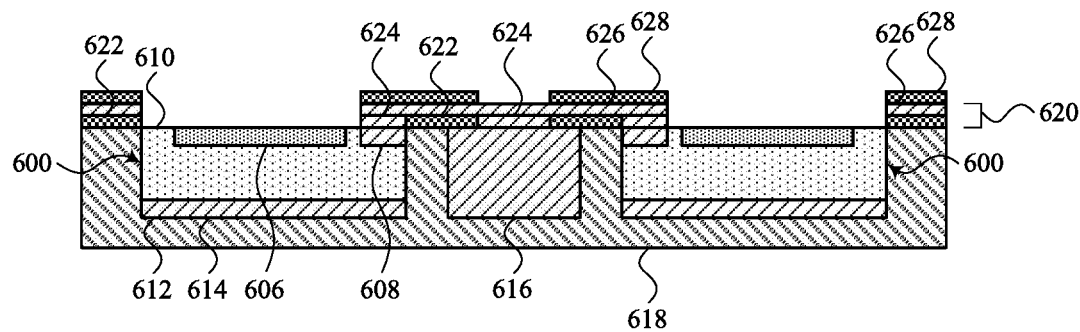

After the filler 618 is molded around the semiconductor chips 600 and block(s) of conductive material 616, the carrier 602 with attached semiconductor chips 600 and blocks of conductive material 616 may be flipped, as shown in FIG. 6C, and the carrier 602 may be removed. In some cases, the carrier 602 and adhesive 604 may be removed from the semiconductor chips 600, blocks of conductive material 616, and filler 618 (e.g., molded epoxy) by exposing the carrier 602 or adhesive 604 to electromagnetic radiation or heat. Thereafter, a first set of redistribution layers (e.g., one or more redistribution layers) may be formed to electrically connect each semiconductor chip 600 to one or more blocks of conductive material 616. In this regard, FIG. 6D shows the formation of an optional set of dielectrics 622 over upper surfaces of the filler 618. The dielectrics 622 may in some cases extend over portions of the conductors 608 or blocks of conductive material 616. The dielectrics 622 may electrically insulate the first set of redistribution layers from the filler 618 (which filler 618 may be non-conductive or minimally conductive). FIG. 6E shows the formation of the first set of redistribution layers 620. The redistribution layer(s) may electrically connect conductors 608 on the front surfaces 610 of the semiconductor chips 600 to one or more of the blocks of conductive material 616. The first set of redistribution layers 620 may include a first redistribution layer and a second redistribution layer. The first redistribution layer may be formed in the same layer as the set of dielectrics 622, and may include conductive elements 624 (e.g., planar conductors or conductive traces) that contact individual ones of the conductors 608 or blocks of conductive material 616. The second redistribution layer may be formed on top of the first redistribution layer and may include conductive elements 626 (e.g., additional planar conductors or conductive traces) that electrically connect the conductive elements 624 in the first redistribution layer. FIG. 6F shows the formation of an optional set of dielectrics 628 that cover and protect portions of the redistribution layers 620 that do not need to be exposed to the exterior surface of a semiconductor chip package.

In an alternative to the redistribution layers 620 shown in FIGS. 6E and 6F, a single redistribution layer may electrically connect conductors 608 on the front surfaces 610 of the semiconductor chips 600 to one or more blocks of conductive material 616. In this first alternative, the filler 618 may be a non-conductive filler. In another alternative to the redistribution layers 620 shown in FIGS. 6E and 6F, more than two redistribution layers may be formed and used to electrically connect conductors 608 on the front surfaces 610 of the semiconductor chips 600 to one or more blocks of conductive material 616. In any of the embodiments described, the outer dielectrics 628 are optional.

Figure 6G:
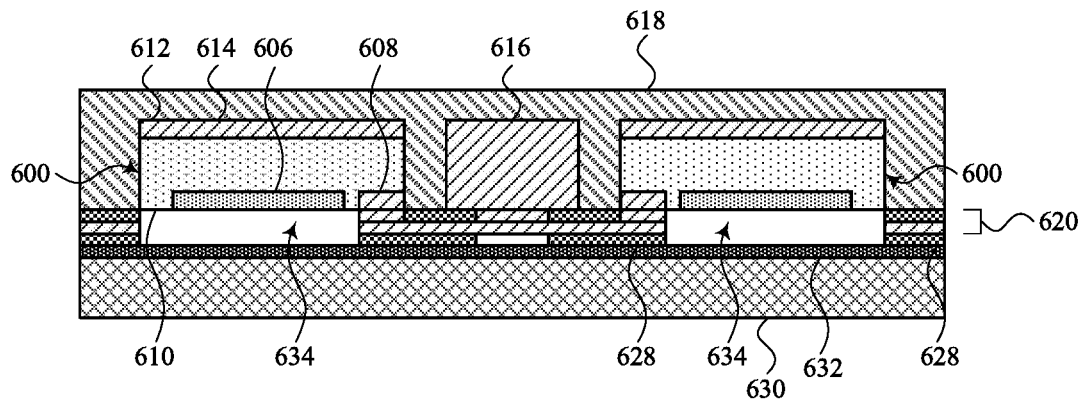

After forming the first set of redistribution layers 620, the structure shown in FIG. 6F may be flipped, as shown in FIG. 6G, and the structure may be attached to a second carrier 630. In some cases, the dielectrics 628 that cover the redistribution layers 620 may be adhered to a surface of the carrier 630 by a liquid or solid adhesive 632, or by other means. In some cases, exposure of the adhesive 632 to electromagnetic radiation or heat may cause the dielectrics 628 to attach to (or be released from) the carrier 630. The height of the redistribution layers 620 and associated dielectrics 622, 628 may create voids 634 between the semiconductor chips 600 and carrier 630, which voids 634 may prevent the semiconductor chips 600 from coming into contact with the adhesive 632 and prevent the LEDs 606 or other circuitry on-board the semiconductor chips 600 from being damaged.

Figure 6H:
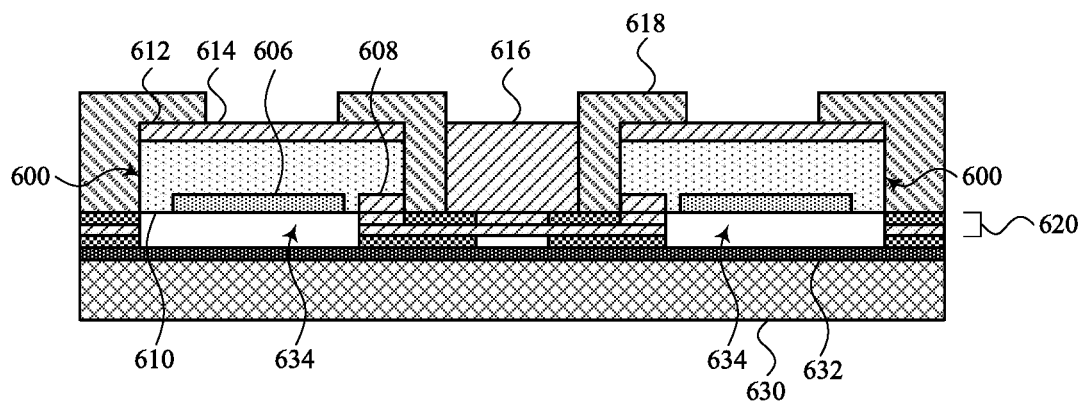

As shown in FIG. 6H, the exposed side of the filler 618 may be removed to expose the back surfaces 614 of the semiconductor chips 600. In some cases, the filler 618 may be removed by drilling (e.g., laser drilling).

Figure 6I:
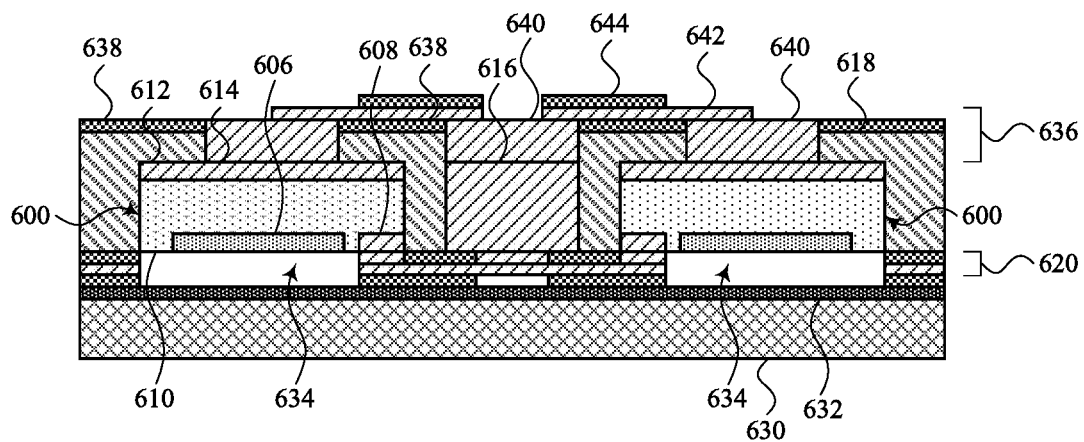

FIG. 6I shows the formation of a second set of redistribution layers 636 (e.g., one or more redistribution layers) that electrically connect each semiconductor chip 600 to one or more blocks of conductive material 616. In some examples, the second set of redistribution layers 636 may be formed similarly to the first set of redistribution layers 620. For example, prior to forming the second set of redistribution layers 636, an optional set of dielectrics 638 may be formed over upper surfaces of the filler 618. The dielectrics 638 may electrically insulate the second set of redistribution layers 636 from the filler 618. After forming the dielectrics 638, the second set of redistribution layers 636 may be formed. The redistribution layer(s) 636 may electrically connect conductors 612 on the back surfaces 614 of the semiconductor chips 600 to one or more blocks of conductive material 616. In some examples, the second set of redistribution layers 636 may include a first redistribution layer and a second redistribution layer. The first redistribution layer may extend from the back surfaces 614 of the semiconductor chips 600 to the same layer as the set of dielectrics 638, and may include conductive elements 640 (e.g., planar conductors or conductive traces) that contact individual ones of the conductors 612 or blocks of conductive material 616. The conductive elements 640 may therefore be at least partially surrounded by the filler 618. The second redistribution layer may be formed on top of the first redistribution layer and may include conductive elements 642 (e.g., planar conductors or conductive traces) that electrically connect different conductive elements 640 in the first redistribution layer. An optional set of dielectrics 644 may be formed over portions of the redistribution layer(s) 636 to cover and protect portions of the redistribution layer(s) 636.

Figure 6J:
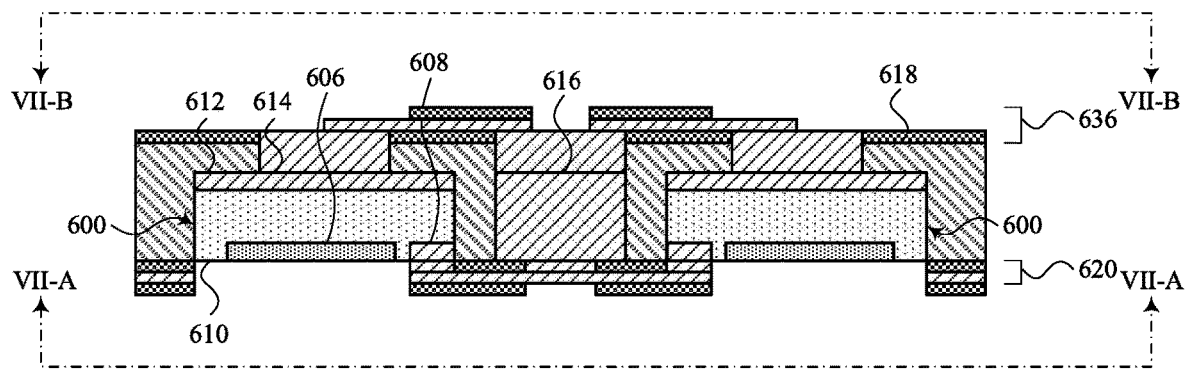

Following formation of the second set of redistribution layers 636, the carrier 630 may be removed, as shown in FIG. 6J. In some cases, the carrier 630 and adhesive 632 may be removed from the dielectrics 628 by exposing the carrier 630 or adhesive 632 to electromagnetic radiation or heat.

Figure 6K:
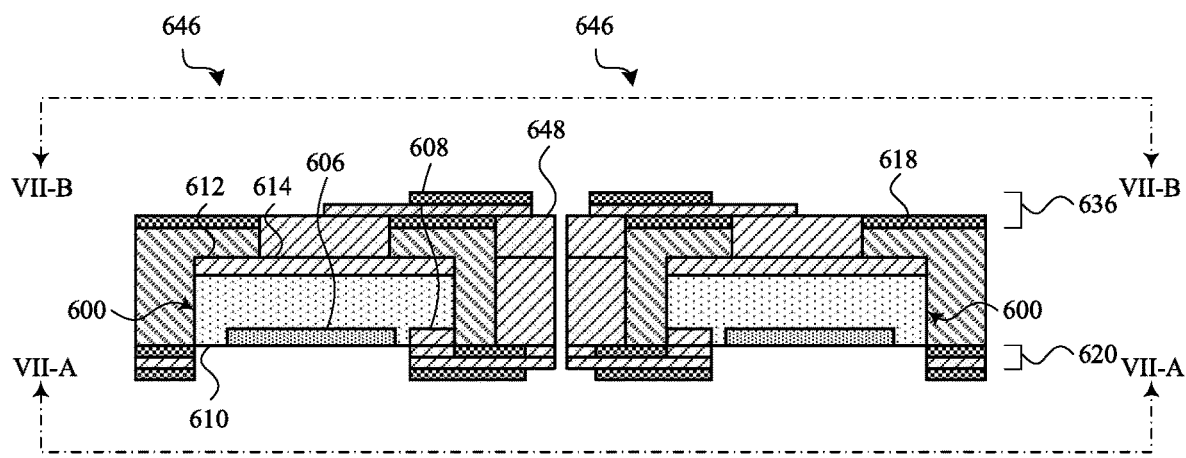

Following removal of the carrier 630, semiconductor chip packages 646 may be separated (e.g., diced) from the monolithic structure that includes multiple packaged semiconductor chips 600. The semiconductor chip packages 646 may be separated from the monolithic structure using a mechanical or laser cutter (e.g., a saw or a laser), as shown in FIG. 6K. The semiconductor chip packages 646 may be separated by cutting through the filler 618 and block(s) of conductive material 616. Cut lines may extend through the block(s) of conductive material 616, thereby exposing face(s) of the block(s) of conductive material 616 to an exterior (e.g., at least one exterior edge) of each semiconductor chip package 646, and enabling the blocks of conductive material 616 to function as electrodes 648 for electrically connecting the semiconductor chip packages 646 to substrates or other devices. More particularly, the set of electrodes 648 formed by cutting through the block(s) of conductive material 616 may be used to mount each semiconductor chip package 646 such that the semiconductor chip 600 included in the package 646 is oriented perpendicularly to the substrate or device on which the semiconductor chip packages 646 is mounted. In some embodiments, the electrodes 648 may be coated with nickel and/or gold (e.g., NiAu).

By way of example, the semiconductor chip packages 646 shown in FIG. 6K are separated by cut lines formed perpendicular to the front and rear surfaces 610, 614 of the semiconductor chips 600. In alternative embodiments, a saw or laser may be angled at an acute angle with respect to the front and rear surfaces 610, 614 when making one or more of the cuts. For example, a cut through the blocks of conductive material 616 may be made at an acute angle with respect to a plane parallel to the front and rear surfaces 610, 614 (or first and second major surfaces) of the semiconductor chips 600, thereby causing edges to which the electrodes 648 are exposed to have an orientation that forms an acute angle with respect to the plane, and providing the electrodes 648 with mounting surfaces that enable each semiconductor chip 600 to be oriented at an acute angle with respect to a substrate on which one or both of the semiconductor chip packages 646 is mounted.

wherein the exterior edge of the semiconductor chip package, to which the set of electrodes is exposed, forms an acute angle with respect to a plane parallel to the first major surface of the semiconductor chip.

In some embodiments, adjacent semiconductor chips may be placed on the carrier 602 described with reference to FIG. 6A with different orientations, or the redistribution layers 620, 636 may be formed with different orientations, to enable the production of like (or same orientation) semiconductor chip packages 646.

The front surface 610 of each semiconductor chip 600 shown in FIG. 6K may be exposed to an exterior surface of the semiconductor chip package 646. Alternatively, a first major surface of any type of semiconductor chip may be exposed to an exterior surface of the semiconductor chip package 646, or both major surfaces of a semiconductor chip may be covered by the filler 618.

The method described with reference to FIGS. 6A-6K may in some cases provide chip scale packages for semiconductor chips 600. A chip scale package is defined herein as a semiconductor chip package that increases the semiconductor chip volume by no more than 20%.

Figure 7A:
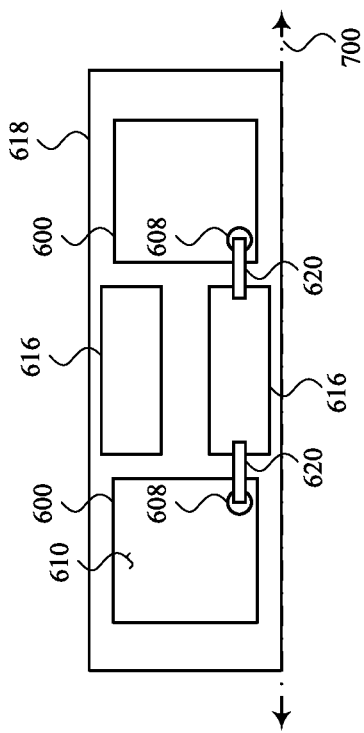
FIGS. 7A and 7B show example plan views of the structure shown in FIG. 6I.
Figure 7B:
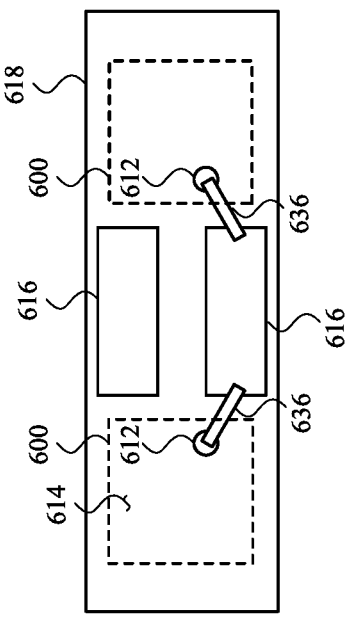
Figure 8A:
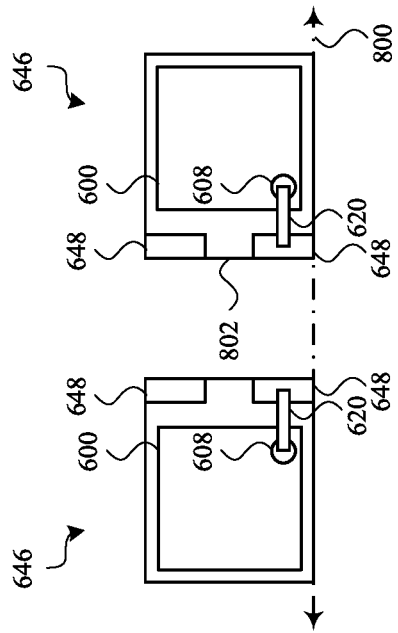
FIGS. 8A and 8B show example plan views of the separated semiconductor chip packages shown in FIG. 6J.
Figure 8B:
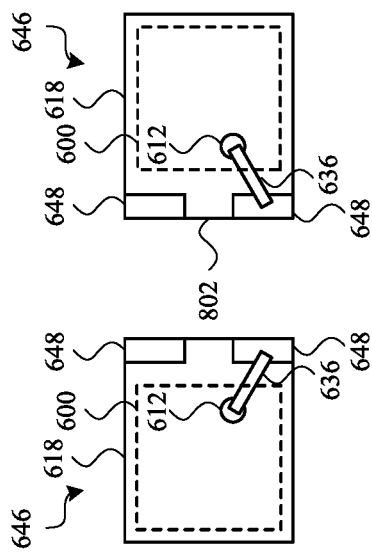

FIGS. 7A and 7B show example plan views of the structure shown in FIG. 6J. FIG. 7A shows a plan view of the front or light-emitting side (in the absence of the set of dielectrics 628), and FIG. 7B shows a plan view of the back or non-light-emitting side (in the absence of the set of dielectrics 644). FIGS. 8A and 8B show example plan views of the separated semiconductor chip packages 646 shown in FIG. 6K. More particularly, FIG. 8A shows a plan view of the front or light-emitting sides of the semiconductor chip packages 646, and FIG. 7B shows a plan view of the back or non-light-emitting sides of the semiconductor chip packages 646. Note that FIG. 7B shows the structure of FIG. 7A after it is flipped about the axis 700. Similarly, FIG. 8B shows the semiconductor chip packages 746 of FIG. 8A after they are flipped about the axis 800.

As shown in FIG. 7A, a conductor 608 on the front surface 610 of each semiconductor chip 600 may be electrically connected to a first block of conductive material 616 by a first set of redistribution layers 620. Similarly, and as shown in FIG. 7B, a conductor 612 on the back surface 614 of each semiconductor chip 600 may be electrically connected to a second block of conductive material 616 by a second set of redistribution layers 636.

When the semiconductor chip packages 646 shown in FIGS. 8A and 8B are separated from the structure shown in FIGS. 7A-7B, the blocks of conductive material 616 form a set of electrodes 648 along an exterior edge 802 of each semiconductor chip package 646 (e.g., along a same exterior edge). In the embodiment shown in FIGS. 8A-8B, the set of electrodes 648 may include a first electrode 648 and a second electrode 648.

As shown in FIGS. 6K, 8A, and 8B, the set of electrodes 648 may be positioned apart from a semiconductor chip 600 and overlap only one edge of a semiconductor chip 600. In other words, an invisible plane may pass between a semiconductor chip 600 and its set of electrodes 648, without intersecting either the semiconductor chip 600 or the set of electrodes 648.

Figure 10A:
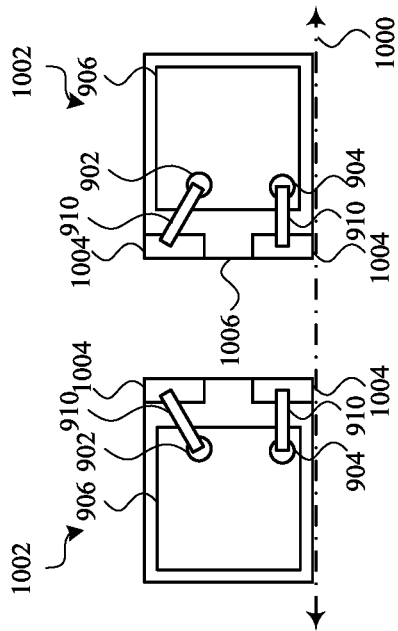
FIGS. 10A and 10B show example plan views of the semiconductor chip packages that may be separated from the structure shown in FIGS. 9A and 9B.
Figure 10B:
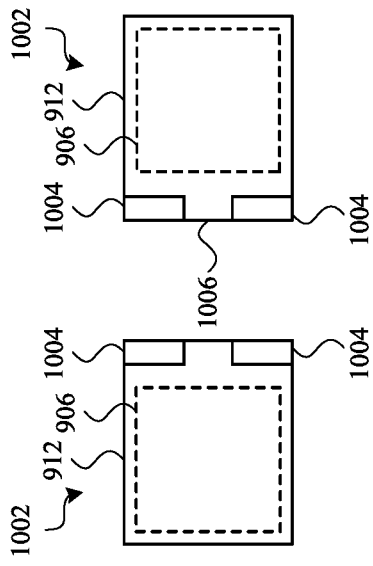
Figure 9A:
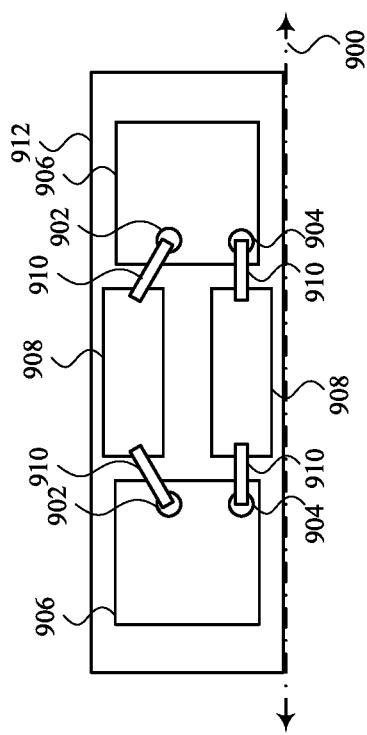
FIGS. 9A and 9B show example alternative plan views of a structure similar to that which is shown in FIG. 6I.
Figure 9B:
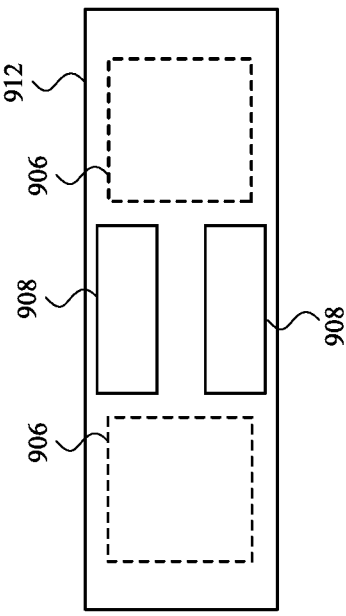

FIGS. 9A and 9B show example alternative plan views of a structure similar to that which is shown in FIG. 6J. FIG. 9A shows a plan view of the front or light-emitting side, and FIG. 9B shows a plan view of the back or non-light-emitting side. FIGS. 10A and 10B show example plan views of the semiconductor chip packages 1002 that may be separated from the structure shown in FIGS. 9A and 9B. More particularly, FIG. 10A shows a plan view of the front or light-emitting sides of the semiconductor chip packages 1002, and FIG. 10B shows a plan view of the back or non-light-emitting sides of the semiconductor chip packages 1002. Note that FIG. 9B shows the structure of FIG. 9A after it is flipped about the axis 900. Similarly, FIG. 10B shows the semiconductor chip packages 1002 of FIG. 10A after they are flipped about the axis 1000.

FIGS. 9A-10B show that conductors 902, 904 on the semiconductor chips 906 may vary in number or position, but may still be electrically connected to blocks of conductive material 908 via a set or sets of redistribution layers 910. By way of example, the semiconductor chips 906 shown in FIGS. 9A-10B each have two conductors 902, 904 on a front surface, and no conductors on a back surface. As shown in FIGS. 10A-10B, semiconductor chip packages 1002 may be separated from the structure shown in FIGS. 9A-9B by cutting through the filler 912 and blocks of conductive material 908. The cutting provides semiconductor chip packages 1002 having a set of electrodes 1004 along an exterior edge 1006 of each package 1002.

Figure 11A:
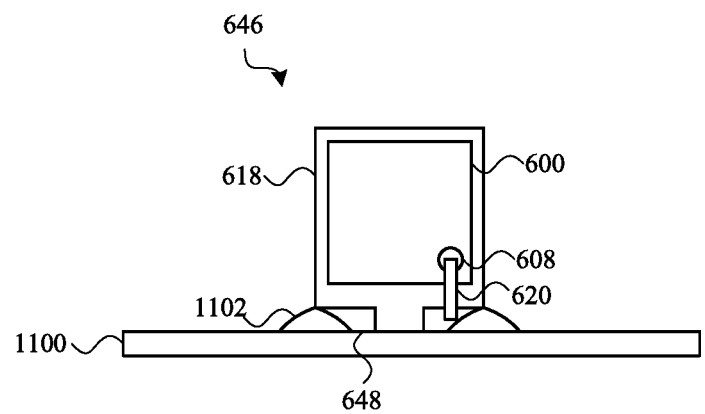
FIGS. 11A and 11B show example elevations of an edge-mountable semiconductor chip package mounted to a substrate.
Figure 11B:
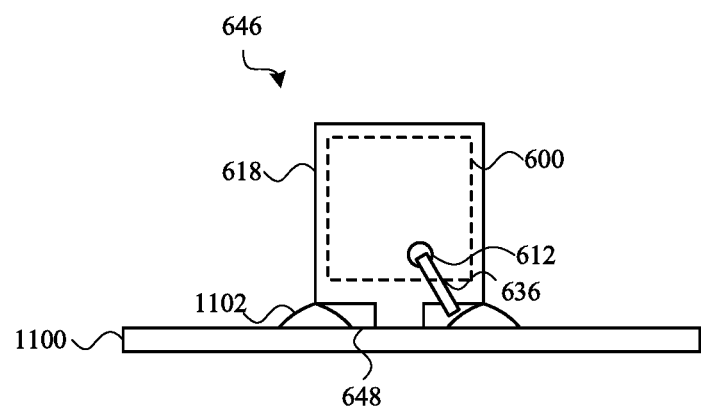

FIGS. 11A and 11B show example elevations of an edge-mountable semiconductor chip package mounted to a substrate. By way of example, the edge-mountable semiconductor chip package is shown to be one of the packages 646 described with reference to FIGS. 6K, 8A, and 8B. An exterior edge of the package 646 including electrodes 648 may be abutted to the substrate 1100, such that the major surfaces of the package 646 are oriented perpendicular to the substrate 1100. Solder bumps 1102 on the substrate 1100 may then be reflowed to mechanically and electrically connect the package 646 to the substrate 1100 via the electrodes 648 and solder 1102, or liquid solder 1102, may be applied after the package 646 has been abutted to the substrate 1100 (e.g., to junctions between the electrodes 648 and corresponding bond pads on the substrate 1100. Regardless of whether solder 1102 is applied before or after the semiconductor chip package 646 is placed on the substrate 1100, sidewall solder filleting (wetting) may be achieved. Sidewall solder filleting may provide better solder joint reliability and drop performance, and may provide a better opportunity to inspect solder joints, than when reflowing solder that is entirely underneath a semiconductor chip package.

In some cases, an edge-mountable semiconductor chip package may be placed on a substrate or device using pick-n-place equipment. In some embodiments, a conductive or non-conductive underfill may be used to fill any void between a mounting edge of an edge-mountable semiconductor chip package and a substrate. The underfill may in some cases be used as an additional attachment mechanism, and may enhance the mechanical bonding of an edge-mountable semiconductor chip package to a substrate.

Figure 12:
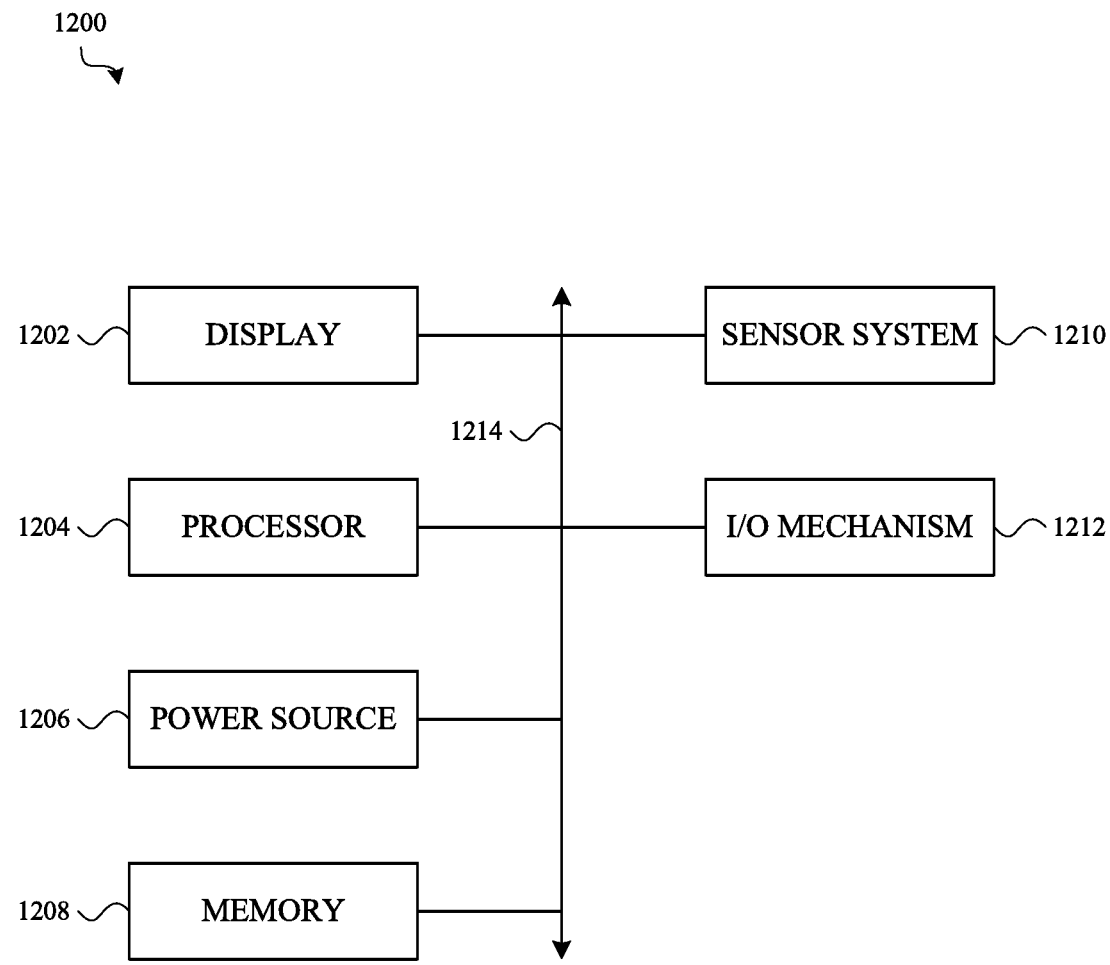
FIG. 12 shows an example electrical block diagram of an electronic device.

FIG. 12 shows a sample electrical block diagram of an electronic device 1200, which electronic device may in some cases take the form of the device described with reference to FIGS. 1A-1B or FIGS. 2A-2B and/or include a sensor system semiconductor chip package as described with reference to any of FIGS. 3-11B. The electronic device 1200 may include a display 1202 (e.g., a light-emitting display), a processor 1204, a power source 1206, a memory 1208 or storage device, a sensor system 1210, or an input/output (I/O) mechanism 1212 (e.g., an input/output device, input/output port, or haptic input/output interface). The processor 1204 may control some or all of the operations of the electronic device 1200. The processor 1204 may communicate, either directly or indirectly, with some or all of the other components of the electronic device 1200. For example, a system bus or other communication mechanism 1214 can provide communication between the display 1202, the processor 1204, the power source 1206, the memory 1208, the sensor system 1210, and the I/O mechanism 1212.

The processor 1204 may be implemented as any electronic device capable of processing, receiving, or transmitting data or instructions, whether such data or instructions is in the form of software or firmware or otherwise encoded. For example, the processor 1204 may include a microprocessor, a central processing unit (CPU), an application-specific integrated circuit (ASIC), a digital signal processor (DSP), a controller, or a combination of such devices. As described herein, the term "processor" is meant to encompass a single processor or processing unit, multiple processors, multiple processing units, or other suitably configured computing element or elements.

It should be noted that the components of the electronic device 1200 can be controlled by multiple processors. For example, select components of the electronic device 1200 (e.g., the sensor system 1210) may be controlled by a first processor and other components of the electronic device 1200 (e.g., the display 1202) may be controlled by a second processor, where the first and second processors may or may not be in communication with each other.

The power source 1206 can be implemented with any device capable of providing energy to the electronic device 1200. For example, the power source 1206 may include one or more batteries or rechargeable batteries. Additionally or alternatively, the power source 1206 may include a power connector or power cord that connects the electronic device 1200 to another power source, such as a wall outlet.

The memory 1208 may store electronic data that can be used by the electronic device 1200. For example, the memory 1208 may store electrical data or content such as, for example, audio and video files, documents and applications, device settings and user preferences, timing signals, control signals, and data structures or databases. The memory 1208 may include any type of memory. By way of example only, the memory 1208 may include random access memory, read-only memory, Flash memory, removable memory, other types of storage elements, or combinations of such memory types.

The electronic device 1200 may also include one or more sensor systems 1210 positioned almost anywhere on the electronic device 1200. In some cases, sensor systems 1210 may be positioned as described with reference to FIGS. 1A-1B, or FIGS. 2A-2B. The sensor system(s) 1210 may be configured to sense one or more type of parameters, such as but not limited to, light; touch; force; heat; movement; relative motion; biometric data (e.g., biological parameters) of a user; air quality; proximity; position; connectedness; and so on. By way of example, the sensor system(s) 1210 may include a heat sensor, a position sensor, a light or optical sensor, an accelerometer, a pressure transducer, a gyroscope, a magnetometer, a health monitoring sensor, and an air quality sensor, and so on. Additionally, the one or more sensor systems 1210 may utilize any suitable sensing technology, including, but not limited to, magnetic, electromagnetic, capacitive, ultrasonic, resistive, optical, acoustic, piezoelectric, mechanical (e.g., micromechanical), microelectromechanical (e.g., MEMS)), or thermal technologies.

The I/O mechanism 1212 may transmit or receive data from a user or another electronic device. The I/O mechanism 1212 may include the display 1202, a touch sensing input surface, a crown, one or more buttons (e.g., a graphical user interface "home" button), one or more cameras (including an under-display camera), one or more microphones or speakers, one or more ports such as a microphone port, and/or a keyboard. Additionally or alternatively, the I/O mechanism 1212 may transmit electronic signals via a communications interface, such as a wireless, wired, and/or optical communications interface. Examples of wireless and wired communications interfaces include, but are not limited to, cellular and Wi-Fi communications interfaces.

The foregoing description, for purposes of explanation, uses specific nomenclature to provide a thorough understanding of the described embodiments. However, it will be apparent to one skilled in the art, after reading this description, that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art, after reading this description, that many modifications and variations are possible in view of the above teachings.

What is claimed is:

1. A semiconductor chip package, comprising:
    a semiconductor chip having a first major surface opposite a second major surface, and a set of conductors disposed on at least one of the first major surface or the second major surface, the semiconductor chip including a surface-emitting electromagnetic radiation source;
    a set of conductive blocks positioned apart from and coplanar with the semiconductor chip, the set of conductive blocks disposed entirely on one lateral side of the semiconductor chip and having cut surfaces exposed to a lateral exterior edge of the semiconductor chip package, the conductive blocks providing a set of electrodes for attaching the semiconductor chip package to a substrate such that the surface-emitting electromagnetic radiation source has an emission axis parallel to the substrate;
    an epoxy molded between the semiconductor chip and each electrode in the set of electrodes; and
    a set of redistribution layers electrically connecting the set of conductors to the set of electrodes; wherein,
    an imaginary plane extending parallel to and between the first and second major surfaces intersects the set of electrodes.

2. The semiconductor chip package of claim 1, wherein:
    the semiconductor chip has a set of lateral edges extending between the first major surface and the second major surface; and
    the epoxy is molded around the set of lateral edges of the semiconductor chip.

3. The semiconductor chip package of claim 1, wherein the set of redistribution layers comprises:
    a first set of redistribution layers electrically connecting at least a first conductor on the first major surface of the semiconductor chip to at least a first electrode of the set of electrodes; and
    a second set of redistribution layers electrically connecting at least a second conductor on the second major surface of the semiconductor chip to at least a second electrode of the set of electrodes.

4. The semiconductor chip package of claim 3, wherein the second set of redistribution layers comprises a redistribution layer that is at least partially surrounded by the epoxy.

5. The semiconductor chip package of claim 1, further comprising:
    a set of dielectrics electrically insulating the set of redistribution layers from the molded epoxy.

6. The semiconductor chip package of claim 1, wherein the set of electrodes comprises a first electrode and a second electrode.

7. The semiconductor chip package of claim 1, wherein the first major surface of the semiconductor chip is exposed to an exterior surface of the semiconductor chip package.

8. The semiconductor chip package of claim 1, wherein the semiconductor chip comprises a first semiconductor chip, and the semiconductor chip package further comprises a second semiconductor chip.

9. The semiconductor chip package of claim 1, wherein the exterior lateral edge of the semiconductor chip package, to which the set of electrodes is exposed, forms an acute angle with respect to a plane parallel to the first major surface of the semiconductor chip.

10. A sensor system, comprising:
    a substrate;
    a first semiconductor chip package mounted on a surface of the substrate, the first semiconductor chip package including a sensor, the sensor having a sensor surface parallel to the surface of the substrate; and
    a second semiconductor chip package mounted on the surface of the substrate;
    wherein:
    the second semiconductor chip package comprises,
        a semiconductor chip oriented perpendicularly to the substrate; and
        a set of electrodes electrically connected to the semiconductor chip, the set of electrodes comprising conductive blocks that are laterally offset from and coplanar with the semiconductor chip, the set of conductive blocks including a conductive block positioned at least partially between a lateral edge of the semiconductor chip and the substrate;
    the semiconductor chip includes a surface-emitting electromagnetic radiation source; and
    the surface-emitting electromagnetic radiation source is configured to emit electromagnetic radiation along an emission axis parallel to the surface of the substrate, the electromagnetic radiation impinging directly on the sensor surface.

11. The sensor system of claim 10, wherein:
the electromagnetic radiation emitted by the surface-emitting electromagnetic radiation source comprises ultraviolet light that impinges directly on the sensor surface.

12. The sensor system of claim 10, wherein:
the electromagnetic radiation emitted by the surface-emitting electromagnetic radiation source comprises infrared light that impinges directly on the sensor surface.

13. The sensor system of claim 10, wherein each of the first semiconductor chip package and the second semiconductor chip package comprises a chip scale package.

14. The sensor system of claim 10, wherein the sensor is an electromagnetic radiation sensor.

15. The sensor system of claim 10, wherein the sensor is a resistive gas sensor.

16. A sensor system, comprising:
a substrate;
a first semiconductor chip package mounted on a surface of the substrate, the first semiconductor chip package including a sensor, the sensor having a sensor surface perpendicular to the surface of the substrate; and
a second semiconductor chip package mounted on the surface of the substrate;
wherein:
the second semiconductor chip package comprises,
a semiconductor chip oriented perpendicularly to the substrate; and
a set of electrodes electrically connected to the semiconductor chip, the set of electrodes comprising conductive blocks that are laterally offset from and coplanar with the semiconductor chip, the set of conductive blocks including a conductive block positioned at least partially between a lateral edge of the semiconductor chip and the substrate;
the semiconductor chip includes a surface-emitting electromagnetic radiation source; and
the surface-emitting electromagnetic radiation source is configured to emit electromagnetic radiation along an emission axis parallel to the surface of the substrate, the electromagnetic radiation impinging directly on the sensor surface.

17. The sensor system of claim 16, wherein:
the electromagnetic radiation emitted by the surface-emitting electromagnetic radiation source comprises ultraviolet light that impinges directly on the sensor surface.

18. The sensor system of claim 16, wherein:
the electromagnetic radiation emitted by the surface-emitting electromagnetic radiation source comprises infrared light that impinges directly on the sensor surface.

19. The sensor system of claim 16, wherein the sensor is an electromagnetic radiation sensor.

20. The sensor system of claim 16, wherein the sensor is a resistive gas sensor.

* * * * *